United States Patent
Shao et al.

(10) Patent No.: US 10,488,450 B2
(45) Date of Patent: Nov. 26, 2019

(54) ISLANDING DETECTION METHOD AND APPARATUS FOR INVERTER, AND POWER SUPPLY SYSTEM

(71) Applicant: Huawei Technologies Co., Ltd., Shenzhen (CN)

(72) Inventors: Zhangping Shao, Shanghai (CN); Kai Xin, Shanghai (CN); Congyuan Wang, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/278,224

(22) Filed: Feb. 18, 2019

(65) Prior Publication Data
US 2019/0178923 A1    Jun. 13, 2019

Related U.S. Application Data

(63) Continuation of application No. PCT/CN2017/071004, filed on Jan. 12, 2017.

(30) Foreign Application Priority Data

Aug. 18, 2016   (CN) .......................... 2016 1 0686005

(51) Int. Cl.
 *G01R 23/15*    (2006.01)
 *G01R 31/02*    (2006.01)
 (Continued)

(52) U.S. Cl.
 CPC .......... *G01R 23/15* (2013.01); *G01R 31/024* (2013.01); *H02J 3/383* (2013.01);
 (Continued)

(58) Field of Classification Search
 CPC .................. H02M 2001/0012; H02M 7/53873
 (Continued)

(56) References Cited

U.S. PATENT DOCUMENTS 5,493,485 A * 2/1996 Okado ................. H02H 7/1227
                                                   363/56.01
6,172,889 B1 * 1/2001 Eguchi ..................... H02J 3/38
                                                   363/55
(Continued)

FOREIGN PATENT DOCUMENTS

CN     102253283 A    11/2011
CN     102270854 A    12/2011
(Continued)

OTHER PUBLICATIONS

Machine Translation and Abstract of Chinese Publication No. CN102253283, Nov. 23, 2011, 17 pages.
(Continued)

*Primary Examiner* — Gary A Nash
(74) *Attorney, Agent, or Firm* — Conley Rose, P.C.

(57) ABSTRACT

An islanding detection method and apparatus for an inverter, and a power supply system to resolve a problem that an existing voltage total harmonic distortion (THD)-based islanding detection method has low islanding detection reliability due to existence of a relatively large detection dead zone. According to this detection method, the voltage total harmonic distortion changes more significantly before and after the islanding effect of the inverter occurs in order to reduce an islanding detection dead zone and improve islanding detection reliability.

20 Claims, 6 Drawing Sheets

(51) Int. Cl.
*H02J 3/38* (2006.01)
*H02M 1/00* (2006.01)
*H02M 7/5387* (2007.01)

(52) U.S. Cl.
CPC .... *H02J 2003/388* (2013.01); *H02M 7/53873* (2013.01); *H02M 2001/0012* (2013.01)

(58) Field of Classification Search
USPC .................. 363/40–43, 55, 56.05, 78, 95
See application file for complete search history.

(56) References Cited

U.S. PATENT DOCUMENTS

| | | | |
|---|---|---|---|
| 7,016,793 B2* | 3/2006 | Ye | G01R 19/2513 290/40 B |
| 2013/0062957 A1 | 3/2013 | Bhavaraju et al. | |
| 2014/0247632 A1* | 9/2014 | Phadke | H02M 7/02 363/95 |
| 2015/0015301 A1 | 1/2015 | Laaksonen et al. | |

FOREIGN PATENT DOCUMENTS

| | | |
|---|---|---|
| CN | 102879672 A | 1/2013 |
| CN | 103412207 A | 11/2013 |
| CN | 103941118 A | 7/2014 |
| CN | 104062529 A | 9/2014 |
| CN | 104218603 A | 12/2014 |
| CN | 104242350 A | 12/2014 |
| CN | 104321945 A | 1/2015 |
| CN | 105334390 A | 2/2016 |
| CN | 104218602 B | 3/2016 |
| CN | 105391033 A | 3/2016 |
| CN | 105629114 A | 6/2016 |
| EP | 2645517 A1 | 10/2013 |
| JP | 2011015565 A | 1/2011 |
| JP | 2016086574 A | 5/2016 |
| KR | 20050010097 A | 1/2005 |
| KR | 20070025269 A | 3/2007 |

OTHER PUBLICATIONS

Machine Translation and Abstract of Chinese Publication No. CN104062529, Jul. 18, 2007, 12 pages.
Machine Translation and Abstract of Korean Publication No. KR20070025269, Mar. 8, 2007, 23 pages.
Qing, T., et al., "An islanding detection method for photovoltaic power generation system using fluctuation characteristic of point of common coupling harmonic voltage," Power System Protection and Control, 2013, 2 pages.
English Abstract of Qing, T., et al., "An islanding detection method for photovoltaic power generation system using fluctuation characteristic of point of common coupling harmonic voltage," Power System Protection and Control, 2013, 1 page.
Massoud, A.M., et al., "Harmonic distortion-based island detection technique for inverter-based distributed generation," IET Renewable Power Generation, vol. 3 , Issue 4, Apr. 17, 2009, 15 pages.
Mingrong, X., "Mathematical Analysis Method of Power Quality," Modern Power Quality Technology Books, China Electric Power Press, Dec. 2015, 47 pages.
Partial English Translation of Mingrong, X., "Mathematical Analysis Method of Power Quality," Modern Power Quality Technology Books, China Electric Power Press, Dec. 2015, 63 pages.
Foreign Communication From a Counterpart Application, Chinese Application No. 201610686005.3, Chinese Office Action dated Mar. 29, 2019, 7 pages.
Machine Translation and Abstract of Korean Application No. KR20050010097, Jan. 27, 2005, 26 pages.
Sung-Il, J.,et al., An Islanding Detection Method for Distributed Generations Using Voltage Unbalance and Total Harmonic Distortion of Current, IEEE Transactions on Power Delivery (vol. 19, No. 2 , Apr. 2004, pp. 745-752, XP11109811.
Foreign Communication From a Counterpart Application, European Application No. 17840703.7, Extended European Search Report dated May 29, 2019, 6 pages.
Machine Translation and Abstract of Chinese Publication No. CN102270854, Dec. 7, 2011, 14 pages.
Machine Translation and Abstract of Chinese Publication No. CN102879672, Jan. 16, 2013, 14 pages.
Machine Translation and Abstract of Chinese Publication No. CN103412207, Nov. 27, 2013, 20 pages.
Machine Translation and Abstract of Chinese Publication No. CN103941118, Jul. 23, 2014, 11 pages.
Machine Translation and Abstract of Chinese Publication No. CN104218602, Dec. 17, 2014, 25 pages.
Machine Translation and Abstract of Chinese Publication No. CN104218603, Dec. 17, 2014, 26 pages.
Machine Translation and Abstract of Chinese Publication No. CN104242350, Dec. 24, 2014, 10 pages.
Machine Translation and Abstract of Chinese Publication No. CN105334390, Feb. 17, 2016, 17 pages.
Machine Translation and Abstract of Chinese Publication No. CN105391033, Mar. 9, 2016, 21 pages.
Machine Translation and Abstract of Chinese Publication No. CN105629114, Jun. 1, 2016, 13 pages.
Machine Translation and Abstract of Japanese Publication No. JP2011015565, Jan. 20, 2011, 29 pages.
Machine Translation and Abstract of Japanese Publication No. JP2016086574, May 19, 2016, 26 pages.
Foreign Communication From a Counterpart Application, PCT Application No. PCT/CN2017/071004, English Translation of International Search Report dated May 24, 2017, 3 pages.
Foreign Communication From a Counterpart Application, PCT Application No. PCT/CN2017/071004, English Translation of Written Opinion dated May 24, 2017, 3 pages.

* cited by examiner

ISLANDING DETECTION METHOD AND APPARATUS FOR INVERTER, AND POWER SUPPLY SYSTEM

CROSS-REFERENCE TO RELATED APPLICATIONS

This application is a continuation of International Patent Application No. PCT/CN2017/071004 filed on Jan. 12, 2017, which claims priority to Chinese Patent Application No. 201610686005.3 filed on Aug. 18, 2016. The disclosures of the aforementioned applications are hereby incorporated by reference in their entireties.

TECHNICAL FIELD

The present application relates to the circuit field, and in particular, to an islanding detection method and apparatus for an inverter, and a power supply system.

BACKGROUND

Figure 1:
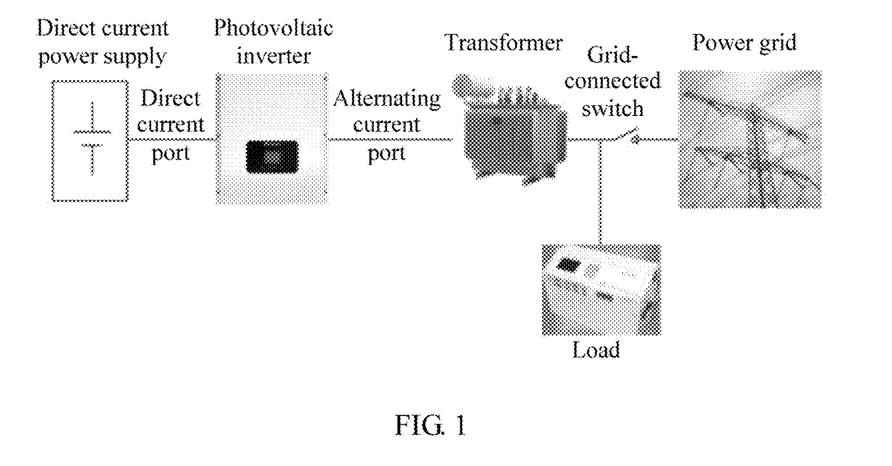
FIG. 1 is a structural diagram of an inverter system.

Inverters are widely applied in the field of grid-connected power generation of new energy, and an inverter is an apparatus that converts direct current power to alternating current power and supplies power to a power grid and a load. A typical inverter system is shown in FIG. 1. A direct current port of an inverter is connected to a direct current power supply and an alternating current port of the inverter is connected to a load, a grid-connected switch, and a power grid using a transformer.

An islanding effect of the inverter is when the grid-connected switch trips, the inverter fails to detect a power-off state in time and cuts itself off from the power grid, and finally a self-powered islanding power generation system including the inverter and the load is formed. The islanding effect brings the following harm to an electric power system and personnel concerned.

(1) The grid-connected switch and a related device may be damaged due to out-of-synchronization closing.

(2) Maintenance personnel who consider that a line is uncharged is subject to safety threats.

(3) The islanding effect may result in a fault removal failure and affect power grid recovery.

The inverter needs to have an islanding detection function. In other approaches, a common islanding detection method is based on a voltage total harmonic distortion (also referred to as THD), and the technical solution is mainly as follows.

(1) Detect an alternating voltage signal from an alternating current port of an inverter, and calculate a voltage THD using the following formula:

$$U\% = \frac{1}{U_1} \cdot \sqrt{\sum_{k=2}^{n} U_k^2},$$

where U% indicates the voltage THD, U indicates a voltage fundamental wave, and Uk indicates a $k^{th}$ voltage harmonic.

(2) Perform averaging processing on U% to obtain an average value U0% of the voltage THD.

(3) When |U%−U0%| is less than or equal to a specified threshold, the inverter determines that islanding does not occur, and continues to supply power to a power grid.

Figure 2:
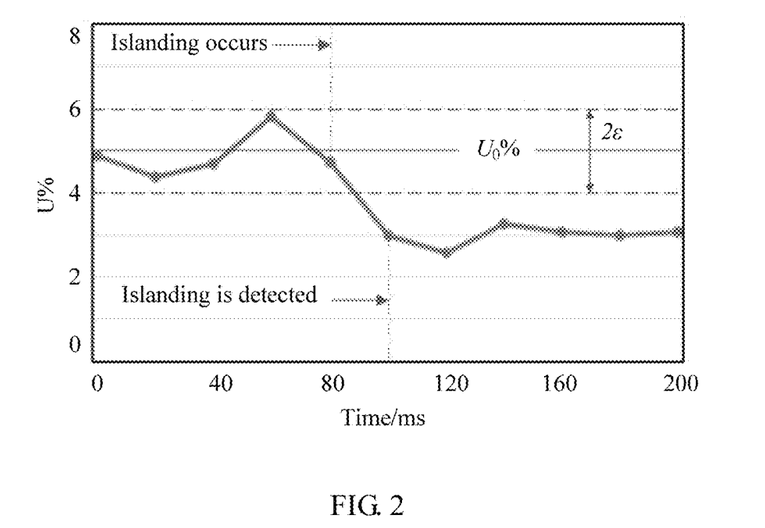
FIG. 2 is a schematic diagram of a voltage THD obtained when islanding of an inverter occurs.

(4) When |U%−U0%| is greater than the specified threshold, as shown in FIG. 2, the inverter determines that islanding occurs, and triggers anti-islanding protection.

Figure 3A:
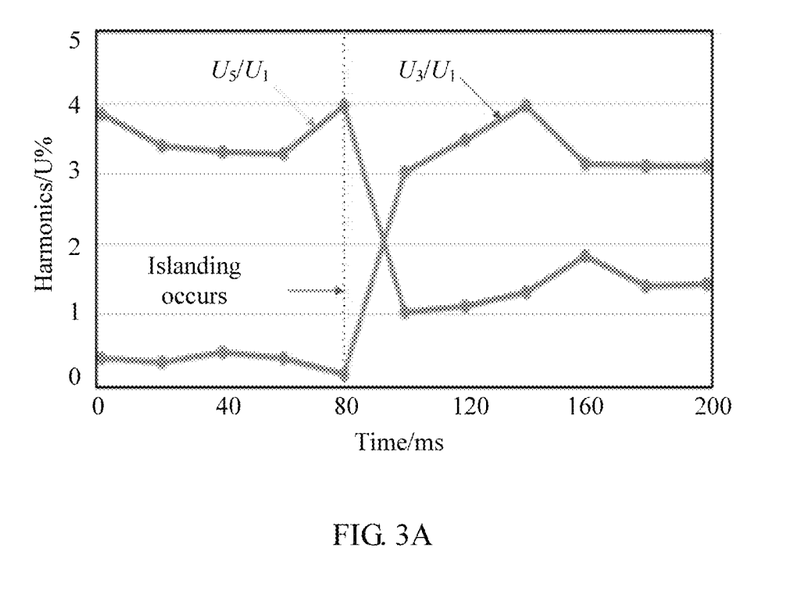
FIG. 3A and FIG. 3B are schematic diagrams of a voltage THD change that exists when islanding of an inverter occurs.
Figure 3B:
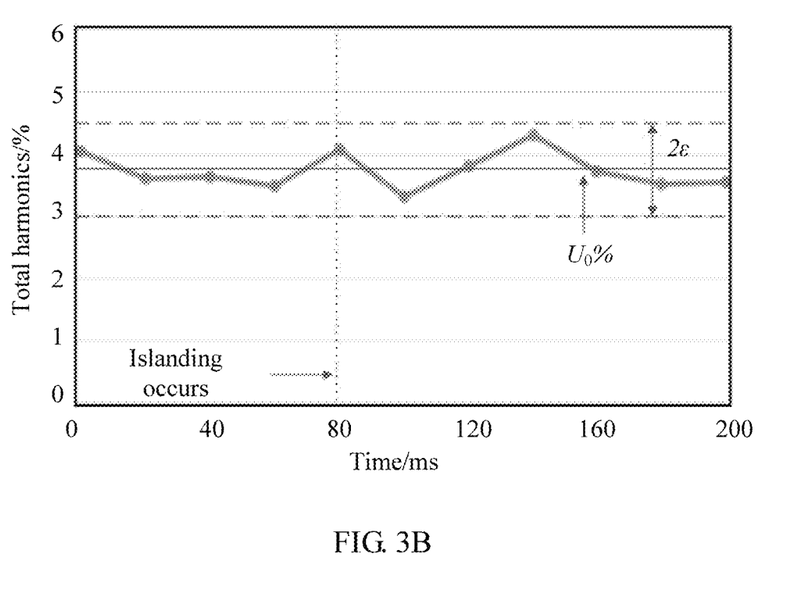

In the voltage THD-based islanding detection method, content of total harmonics is reflected and changes in various harmonics cannot be reflected. When islanding occurs, various harmonics change, but the total harmonics do not change significantly, causing an islanding detection failure. For example, in FIG. 3A, when islanding occurs, a root mean square value of a fifth harmonic decreases while a root mean square value of a third harmonic increases, but a corresponding total harmonic distortion does not change significantly, as shown in FIG. 3B. Therefore, in the voltage THD-based islanding detection method, there is a relatively large detection dead zone and islanding detection reliability is reduced.

SUMMARY

Embodiments of the present application provide an islanding detection method and apparatus for an inverter, and a power supply system to resolve a problem that an existing voltage THD-based islanding detection method has low islanding detection reliability due to existence of a relatively large detection dead zone.

Specific technical solutions provided in the embodiments of the present application are as follows.

According to a first aspect, an islanding detection method for an inverter is provided, including sampling an alternating voltage signal output from an alternating current port of an inverter, performing harmonic analysis on the alternating voltage signal to obtain various voltage harmonics and change rates of the voltage harmonics, determining a voltage total harmonic distortion based on the voltage harmonics and the change rates of the voltage harmonics, and if the voltage total harmonic distortion is greater than a specified threshold of the voltage total harmonic distortion, determining that an islanding effect of the inverter is detected.

In this design, islanding detection is performed on the inverter based on the alternating voltage signal output from the alternating current port of the inverter. This neither requires injection of a specific harmonic nor degrades output power quality of the inverter.

With reference to the first aspect, in a possible design, after sampling an alternating voltage signal output from an alternating current port of an inverter and before the performing harmonic analysis on the alternating voltage signal, the method further includes performing filtering processing on the alternating voltage signal so as to perform harmonic analysis on the alternating voltage signal. In this way, a steady-state alternating voltage signal can be obtained.

With reference to the first aspect, in a possible design, performing harmonic analysis on the alternating voltage signal to obtain various voltage harmonics and change rates of the voltage harmonics includes performing harmonic analysis on the alternating voltage signal using a fast Fourier transformation (FFT) algorithm to obtain the voltage harmonics, calculating an average value of each voltage harmonic based on the voltage harmonic, and obtaining the change rates of the voltage harmonics based on the voltage harmonics and the average values of the voltage harmonics.

With reference to the first aspect, in a possible design, the voltage harmonics and the change rates of the voltage harmonics satisfy the following formulas:

$$A_k = \frac{\sum_{n=0}^{M-1} u[nT]\cos(2k\pi f)}{M/2}$$

$$B_k = \frac{\sum_{n=0}^{M-1} u[nT]\sin(2k\pi f)}{M/2}$$

$$U_k\% = \frac{\sqrt{A_k^2 + B_k^2}}{\sqrt{A_1^2 + B_1^2}} \times 100\%$$

$$\Delta U_k\% = |U_k\% - U_{k0}\%|,$$

where n indicates a quantity of sampling points and n=0, 1, 2, ..., M−1, T indicates a sampling period, f indicates a power frequency, k indicates a harmonic order and k=0, 1, 2, ..., M/2, u[nT] indicates a power grid voltage signal, $A_k$ indicates a cosine amplitude of a $k^{th}$ voltage harmonic, $B_k$ indicates a sine amplitude of the $k^{th}$ voltage harmonic, $U_k\%$ indicates the $k^{th}$ voltage harmonic, $\Delta U_k\%$ indicates a change rate of the $k^{th}$ voltage harmonic, and $U_{k0}\%$ indicates an average value of the $k^{th}$ voltage harmonic.

With reference to the first aspect, in a possible design, the determining a voltage total harmonic distortion based on the voltage harmonics and the change rates of the voltage harmonics includes comparing a change rate of each voltage harmonic and a specified threshold of the change rate of the voltage harmonic to obtain a change factor of the voltage harmonic, and obtaining the voltage total harmonic distortion based on the change factors of the voltage harmonics and the voltage harmonics.

With reference to the first aspect, in a possible design, the voltage total harmonic distortion satisfies the following formulas:

$$U\% = \sum_{k=2}^{n} U_k\% \cdot S_k$$

$$S_k = \begin{cases} 1, & \Delta U_k\% \le \Delta \varepsilon_k \\ -1, & \Delta U_k\% > \Delta \varepsilon_k \end{cases},$$

where U% indicates the voltage total harmonic distortion, $U_k\%$ indicates the $k^{th}$ voltage harmonic, $S_k$ indicates a change factor of the $k^{th}$ voltage harmonic, $\Delta U_k\%$ indicates the change rate of the $k^{th}$ voltage harmonic, and $\Delta \varepsilon_k$ indicates a specified threshold of the change rate of the $k^{th}$ voltage harmonic.

In this design, a simple addition operation is used for calculating the voltage total harmonic distortion. This can reduce operation time and improve operation efficiency.

With reference to the first aspect, in a possible design, an anti-islanding protection signal used for triggering protection for the inverter is output after the islanding effect of the inverter is detected.

In this design, protection for the inverter can be triggered using the output anti-islanding protection signal to prevent the islanding effect of the inverter from causing severe damages to an electric power system or personnel concerned.

According to a second aspect, an islanding detection apparatus for an inverter is provided, including a sampling unit configured to sample an alternating voltage signal output from an alternating current port of an inverter, an analysis unit configured to perform harmonic analysis on the alternating voltage signal to obtain various voltage harmonics and change rates of the voltage harmonics, a determining unit configured to determine a voltage total harmonic distortion based on the voltage harmonics and the change rates of the voltage harmonics, and a detection unit configured to, if the voltage total harmonic distortion is greater than a specified threshold of the voltage total harmonic distortion, determine that an islanding effect of the inverter is detected.

With reference to the second aspect, in a possible design, the sampling unit is further configured to, after sampling the alternating voltage signal output from the alternating current port of the inverter, perform filtering processing on the alternating voltage signal so as to perform harmonic analysis on the alternating voltage signal.

With reference to the second aspect, in a possible design, when performing harmonic analysis on the alternating voltage signal to obtain the voltage harmonics and the change rates of the voltage harmonics, the analysis unit is further configured to perform harmonic analysis on the alternating voltage signal using an FFT algorithm to obtain the voltage harmonics, calculate an average value of each voltage harmonic based on the voltage harmonic, and obtain the change rates of the voltage harmonics based on the voltage harmonics and the average values of the voltage harmonics.

With reference to the second aspect, in a possible design, the voltage harmonics and the change rates of the voltage harmonics satisfy the following formulas:

$$A_k = \frac{\sum_{n=0}^{M-1} u[nT]\cos(2k\pi f)}{M/2}$$

$$B_k = \frac{\sum_{n=0}^{M-1} u[nT]\sin(2k\pi f)}{M/2}$$

$$U_k\% = \frac{\sqrt{A_k^2 + B_k^2}}{\sqrt{A_1^2 + B_1^2}} \times 100\%$$

$$\Delta U_k\% = |U_k\% - U_{k0}\%|,$$

where n indicates a quantity of sampling points and n=0, 1, 2, ..., M−1, T indicates a sampling period, f indicates a power frequency, k indicates a harmonic order and k=0, 1, 2, ..., M/2, u[nT] indicates a power grid voltage signal, $A_k$ indicates a cosine amplitude of a $k^{th}$ voltage harmonic, $B_k$ indicates a sine amplitude of the $k^{th}$ voltage harmonic, $U_k\%$ indicates the $k^{th}$ voltage harmonic, $\Delta U_k\%$ indicates a change rate of the $k^{th}$ voltage harmonic, and $U_{k0}\%$ indicates an average value of the $k^{th}$ voltage harmonic.

With reference to the second aspect, in a possible design, when determining the voltage total harmonic distortion based on the voltage harmonics and the change rates of the voltage harmonics, the determining unit is further configured to compare a change rate of each voltage harmonic and a specified threshold of the change rate of the voltage harmonic to obtain a change factor of the voltage harmonic, and obtain the voltage total harmonic distortion based on the change factors of the voltage harmonics and the voltage harmonics.

With reference to the second aspect, in a possible design, the voltage total harmonic distortion satisfies the following formulas:

$$U\% = \sum_{k=2}^{n} U_k\% \cdot S_k$$

$$S_k = \begin{cases} 1, & \Delta U_k\% \leq \Delta\varepsilon_k \\ -1, & \Delta U_k\% > \Delta\varepsilon_k \end{cases},$$

where U% indicates the voltage total harmonic distortion, $U_k\%$ indicates the $k^{th}$ voltage harmonic, $S_k$ indicates a change factor of the $k^{th}$ voltage harmonic, $\Delta U_k\%$ indicates the change rate of the $k^{th}$ voltage harmonic, and $\Delta\varepsilon_k$ indicates a specified threshold of the change rate of the $k^{th}$ voltage harmonic.

According to a third aspect, a power supply system is provided, including an inverter, a control circuit, and an islanding detection apparatus, where a main circuit of the inverter is connected to the islanding detection circuit and the control circuit, and the control circuit is connected to the islanding detection apparatus, where the inverter is configured to convert direct current power to alternating current power, the islanding detection apparatus is configured to sample an alternating voltage signal output from an alternating current port of the inverter, perform harmonic analysis on the alternating voltage signal to obtain various voltage harmonics and change rates of the voltage harmonics, determine a voltage total harmonic distortion based on the voltage harmonics and the change rates of the voltage harmonics, and if the voltage total harmonic distortion is greater than a specified threshold of the voltage total harmonic distortion, determine that an islanding effect of the inverter is detected, and output an anti-islanding protection signal to the control circuit, and the control circuit is configured to detect the anti-islanding protection signal, and trigger protection for the inverter after detecting the anti-islanding protection signal.

According to a fourth aspect, an islanding detection device is provided, and the device includes a processor, a memory, and a signal collector, where the memory stores a computer-readable program, and the processor runs the program in the memory to control the signal collector in order to implement the islanding detection method provided in the first aspect.

According to a fifth aspect, a computer storage medium is provided, and is configured to store a computer software instruction used in the islanding detection method according to the first aspect, where the computer software instruction includes a program that is designed to execute the method provided in the foregoing aspect.

It can be learned that in the foregoing aspects, during islanding detection performed on the inverter, the alternating voltage signal output from the alternating current port of the inverter is sampled, harmonic analysis is performed on the alternating voltage signal to obtain the various voltage harmonics and the change rates of the voltage harmonics, the voltage total harmonic distortion is determined based on the voltage harmonics and the change rates of the voltage harmonics, and if the voltage total harmonic distortion is greater than the specified threshold of the voltage total harmonic distortion, it is determined that the islanding effect of the inverter is detected. In this way, during islanding detection performed on the inverter, an islanding detection dead zone can be reduced due to a significant change in the voltage total harmonic distortion before and after the islanding effect of the inverter occurs, thereby improving accuracy and reliability of islanding detection.

DESCRIPTION OF EMBODIMENTS

The following clearly describes the technical solutions in the embodiments of the present application with reference to the accompanying drawings in the embodiments of the present application. The described embodiments are merely some but not all of the embodiments of the present application. All other embodiments obtained by a person of ordinary skill in the art based on the embodiments of the present application without creative efforts shall fall within the scope of protection of the present application.

Figure 4:
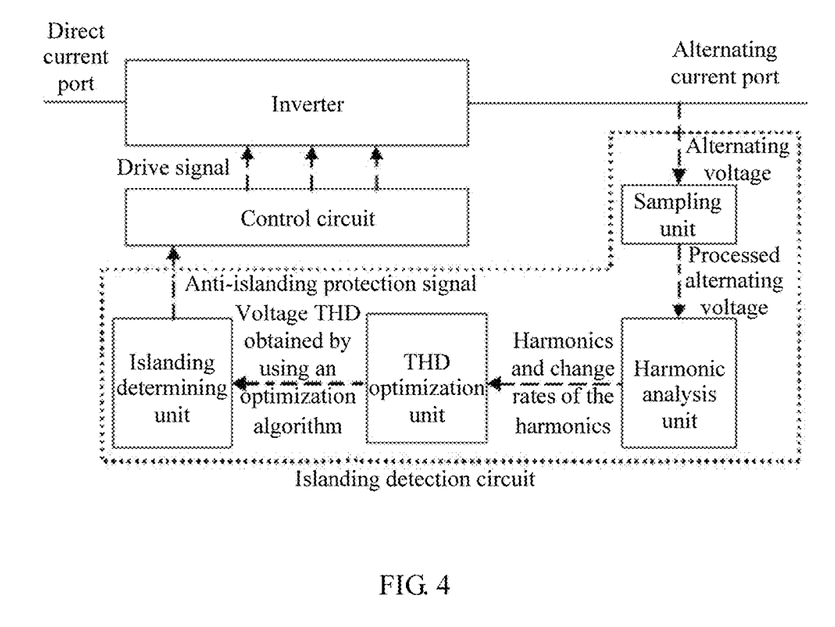
FIG. 4 shows a structure of a power supply system according to an embodiment of the present application.

An embodiment of the present application provides a power supply system that includes an inverter. As shown in FIG. 4, a structure of the system includes the inverter, a control circuit, and an islanding detection circuit.

The inverter is configured to convert direct current power to alternating current power.

The control circuit is configured to sample signals, such as a voltage signal and a current signal, on a direct current side and an alternating current side of the inverter, and perform active and reactive power control, output a drive signal to drive a switching component of a main circuit of the inverter, and detect an anti-islanding protection signal, to directly trigger protection for the inverter or trigger protection for the inverter based on an active islanding detection method.

The islanding detection circuit is configured to identify an islanding state of the inverter, where the islanding detection circuit includes a sampling unit, a harmonic analysis unit, a THD optimization unit, and an islanding determining unit. The sampling unit collects an alternating voltage signal from an alternating port of the inverter, performs filtering processing, and sends the processed voltage signal to the analysis unit. The harmonic analysis unit performs harmonic analysis on the alternating voltage signal using an FFT algorithm to obtain various voltage harmonics and change rates of the voltage harmonics, and sends the voltage harmonics and the change rates of the voltage harmonics to the THD optimization unit. The THD optimization unit determines a voltage total harmonic distortion based on the voltage harmonics and the change rates of the voltage harmonics using a preset voltage THD optimization algorithm, and sends the voltage total harmonic distortion to the islanding determining unit. The islanding determining unit obtains an anti-islanding protection signal based on the obtained voltage total harmonic distortion and an islanding determining condition, and sends the anti-islanding protection signal to the control circuit.

Figure 5:
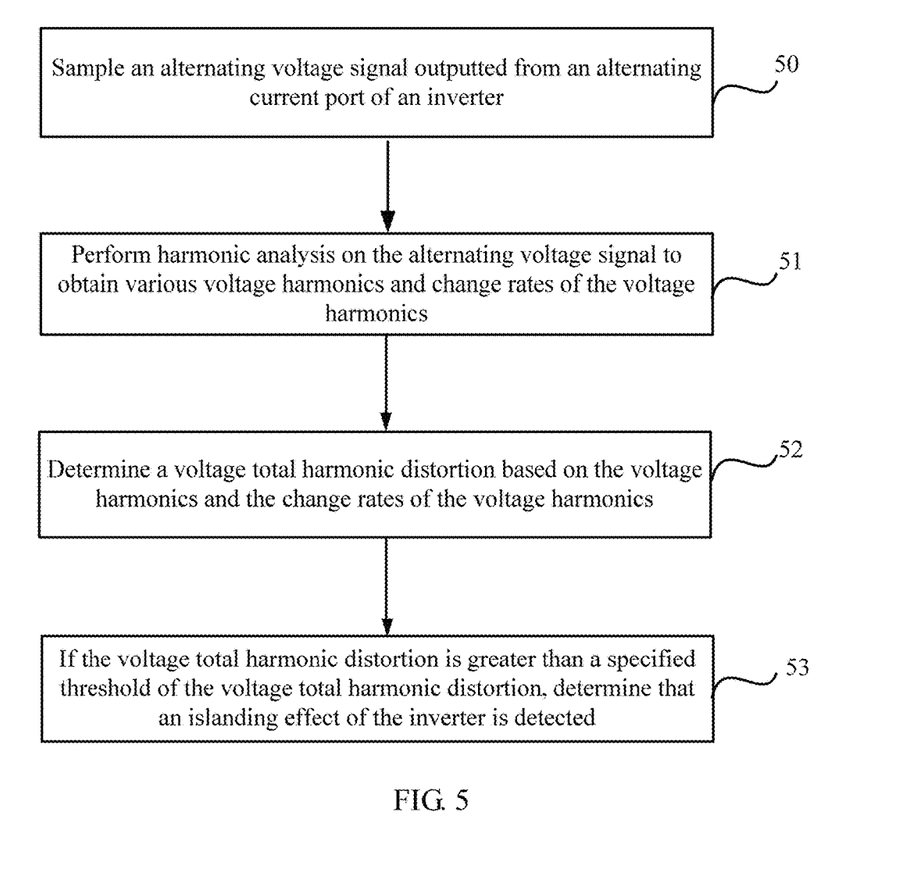
FIG. 5 is a flowchart of an islanding detection method for an inverter according to an embodiment of the present application.

Based on a structural diagram of the power supply system shown in FIG. 4, as shown in FIG. 5, an embodiment of the present application provides an islanding detection method for an inverter. The islanding detection method in FIG. 5 is applicable to various types of grid-connected inverters. An inverter may be a single-phase inverter or a three-phase inverter and may have a two-level topology or a multi-level topology. A specific procedure of the method is as follows.

Step 50: Sample an alternating voltage signal output from an alternating current port of an inverter.

Optionally, after step 50 is performed and before step 51 is performed, filtering processing needs to be further performed on the alternating voltage signal output from the alternating current port of the inverter. In this way, a steady-state voltage signal can be obtained such that harmonic analysis can be performed on the alternating voltage signal.

Step 51: Perform harmonic analysis on the alternating voltage signal to obtain various voltage harmonics and change rates of the voltage harmonics.

The performing harmonic analysis on the alternating voltage signal to obtain various voltage harmonics and change rates of the voltage harmonics can be implemented according to performing harmonic analysis on the alternating voltage signal using an FFT algorithm to obtain the voltage harmonics, calculating an average value of the voltage harmonic based on the voltage harmonic, and obtaining the change rates of the voltage harmonics based on the voltage harmonics and the average values of the voltage harmonics.

Further, during performing harmonic analysis on the alternating voltage signal using the FFT algorithm to obtain the voltage harmonics and the change rates of the voltage harmonics, the voltage harmonics and the change rates of the voltage harmonics satisfy the following formulas:

$$A_k = \frac{\sum_{n=0}^{M-1} u[nT]\cos(2k\pi f)}{M/2}$$

$$B_k = \frac{\sum_{n=0}^{M-1} u[nT]\sin(2k\pi f)}{M/2}$$

$$U_k\% = \frac{\sqrt{A_k^2 + B_k^2}}{\sqrt{A_1^2 + B_1^2}} \times 100\%$$

$$\Delta U_k\% = |U_k\% - U_{k0}\%|,$$

where n indicates a quantity of sampling points and n=0, 1, 2, . . . , M−1, T indicates a sampling period, f indicates a power frequency, k indicates a harmonic order and k=0, 1, 2, . . . , M/2, u[nT] indicates a power grid voltage signal, $A_k$ indicates a cosine amplitude of a $k^{th}$ voltage harmonic, $B_k$ indicates a sine amplitude of the $k^{th}$ voltage harmonic, $U_k\%$ indicates the $k^{th}$ voltage harmonic, $\Delta U_k\%$ indicates a change rate of the $k^{th}$ voltage harmonic, and $U_{k0}\%$ indicates an average value of the $k^{th}$ voltage harmonic, that is, averaging processing is performed on $U_k\%$.

Step 52: Determine a voltage total harmonic distortion based on the voltage harmonics and the change rates of the voltage harmonics.

Determining a voltage total harmonic distortion based on the voltage harmonics and the change rates of the voltage harmonics can be implemented according to the following process comparing a change rate of each voltage harmonic and a specified threshold of the change rate of the voltage harmonic to obtain a change factor of the voltage harmonic, and obtaining the voltage total harmonic distortion based on the change factors of the voltage harmonics and the voltage harmonics.

Further, during determining the voltage total harmonic distortion based on the voltage harmonics and the change rates of the voltage harmonics using a preset voltage THD optimization algorithm, the change rate of the $k^{th}$ voltage harmonic and a specified threshold of the change rate of the $k^{th}$ voltage harmonic are first compared to obtain a change factor $S_k$ of the $k^{th}$ voltage harmonic. To be specific, when $\Delta U_k\%$ is less than or equal to the specified threshold $\Delta \varepsilon_k$ of the change rate of the $k^{th}$ voltage harmonic, $S_k$ is equal to 1, when $\Delta U_k\%$ is greater than $\Delta \varepsilon_k$, $S_k$ is equal to −1. Further, the foregoing case may be indicated using the following formula:

$$S_k = \begin{cases} 1, & \Delta U_k\% \leq \Delta \varepsilon_k \\ -1, & \Delta U_k\% > \Delta \varepsilon_k \end{cases},$$

where $S_k$ indicates the change factor of the $k^{th}$ voltage harmonic, $\Delta U_k\%$ indicates the change rate of the $k^{th}$ voltage harmonic, and $\Delta \varepsilon_k$ indicates the specified threshold of the change rate of the $k^{th}$ voltage harmonic.

It should be noted that, optionally, an absolute value of $S_k$ is not limited to 1, or may be another value. For example, the absolute value of $S_k$ may be set to p, and p is a positive integer, that is $$S_k = \begin{cases} p, & \Delta U_k\% \leq \Delta \varepsilon_k \\ -p, & \Delta U_k\% > \Delta \varepsilon_k \end{cases}.$$

Figure 6:
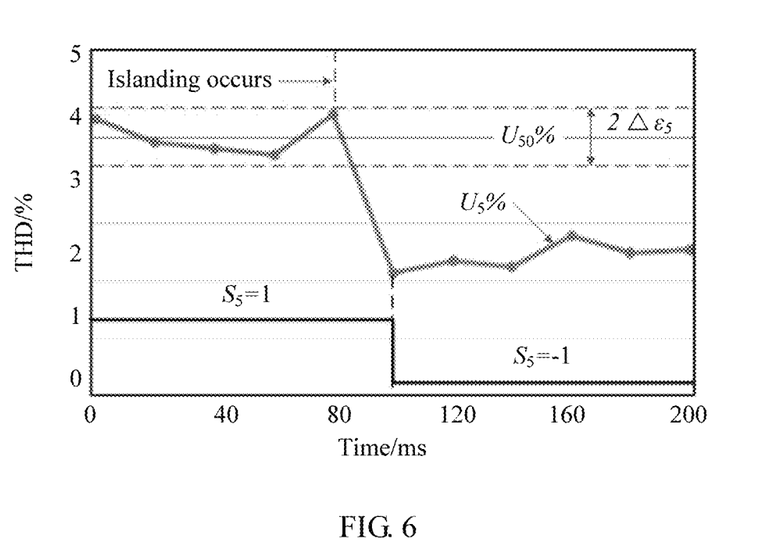
FIG. 6 is a schematic diagram of a change rate of a fifth voltage harmonic according to an embodiment of the present application.

For example, FIG. 6 is a schematic diagram of a change rate of a fifth voltage harmonic. A specified threshold $\Delta \varepsilon_5$ of the change rate of the fifth voltage harmonic is 0.5. It can be seen from the figure that, when the change rate $\Delta U_5\%$ of the fifth voltage harmonic is less than 0.5, $S_5$=1, when the change rate $\Delta U_5\%$ of the fifth voltage harmonic is greater than 0.5, $S_5$=−1.

Then, the voltage total harmonic distortion U% is determined based on the $k^{th}$ voltage harmonic $U_k\%$ and the change factor $S_k$ of the $k^{th}$ voltage harmonic. Further, a calculation formula is as follows:

$$U\% = \sum_{k=2}^{n} U_k\% \cdot S_k,$$

where U% indicates the voltage total harmonic distortion, $U_k\%$ indicates the $k^{th}$ voltage harmonic, and $S_k$ indicates the change factor of the $k^{th}$ voltage harmonic.

Figure 7:
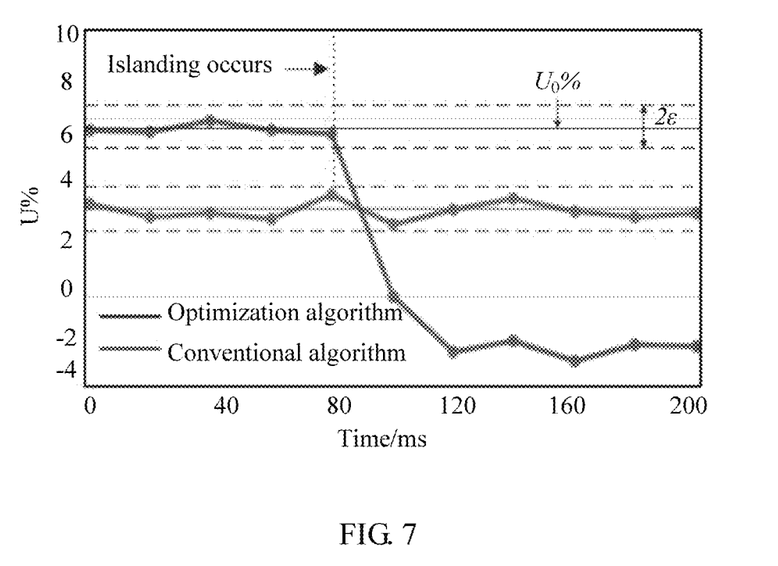
FIG. 7 is a diagram of comparison between voltage total harmonic distortions that are respectively calculated using a conventional algorithm and an islanding detection method according to an embodiment of the present application.

For example, FIG. 7 is a diagram of comparison between voltage total harmonic distortions that are respectively calculated using a conventional algorithm and the foregoing voltage THD optimization algorithm. It can be seen that a harmonic corresponding to the conventional algorithm is always a positive value, and there is no significant change before and after islanding occurs. A harmonic corresponding to the foregoing optimization algorithm may be a positive value or a negative value, and when islanding occurs, a harmonic indicator changes significantly and exceeds a specified threshold of a change rate of the voltage harmonic.

Step 53: If the voltage total harmonic distortion is greater than a specified threshold of the voltage total harmonic distortion, determine that an islanding effect of the inverter is detected.

Further, during detecting whether an islanding effect of the inverter occurs, a relationship between the voltage total harmonic distortion U% and the specified threshold c of the voltage total harmonic distortion is analyzed. If U% is less than or equal to c, it is determined that a power grid connected to the inverter is in a normal state, if U% is greater than c, it is determined that an islanding effect of the inverter occurs, and an anti-islanding protection signal is output and sent to a control circuit. After receiving the anti-islanding protection signal, the control circuit may directly trigger protection for the inverter and switch off the inverter, or trigger inverter protection logic based on the active islanding detection method.

Figure 8:
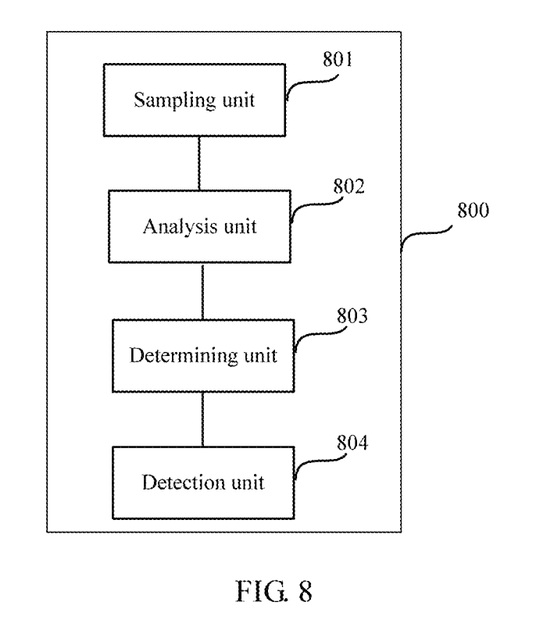
FIG. 8 is a schematic diagram of an islanding detection apparatus for an inverter according to an embodiment of the present application.

Based on the foregoing embodiments, as shown in FIG. 8, FIG. 8 is a schematic structural diagram of an islanding detection apparatus 800 for an inverter according to an embodiment of the present application. The apparatus 800 is applied to various types of inverters. The apparatus 800 includes a sampling unit 801, an analysis unit 802, a determining unit 803, and a detection unit 804, where the sampling unit 801 is configured to sample an alternating voltage signal output from an alternating current port of an inverter, the analysis unit 802 is configured to perform harmonic analysis on the alternating voltage signal to obtain various voltage harmonics and change rates of the voltage harmonics, the determining unit 803 is configured to determine a voltage total harmonic distortion based on the voltage harmonics and the change rates of the voltage harmonics, and the detection unit 804 is configured to, if the voltage total harmonic distortion is greater than a specified threshold of the voltage total harmonic distortion, determine that an islanding effect of the inverter is detected.

Optionally, the sampling unit 801 is further configured to, after sampling the alternating voltage signal output from the alternating current port of the inverter, perform filtering processing on the alternating voltage signal so as to perform harmonic analysis on the alternating voltage signal.

Optionally, when performing harmonic analysis on the alternating voltage signal to obtain the voltage harmonics and the change rates of the voltage harmonics, the analysis unit 802 is further configured to perform harmonic analysis on the alternating voltage signal using an FFT algorithm to obtain the voltage harmonics, calculate an average value of each voltage harmonic based on the voltage harmonic, and obtain the change rates of the voltage harmonics based on the voltage harmonics and the average values of the voltage harmonics.

Optionally, the voltage harmonics and the change rates of the voltage harmonics satisfy the following formulas:

$$A_k = \frac{\sum_{n=0}^{M-1} u[nT]\cos(2k\pi f)}{M/2}$$

-continued $$B_k = \frac{\sum_{n=0}^{M-1} u[nT]\sin(2k\pi f)}{M/2}$$

$$U_k\% = \frac{\sqrt{A_k^2 + B_k^2}}{\sqrt{A_1^2 + B_1^2}} \times 100\%$$

$$\Delta U_k\% = |U_k\% - U_{k0}\%|,$$

where n indicates a quantity of sampling points and n=0, 1, 2, ..., M−1, T indicates a sampling period, f indicates a power frequency, k indicates a harmonic order and k=0, 1, 2, ..., M/2, u[nT] indicates a power grid voltage signal, $A_k$ indicates a cosine amplitude of a $k^{th}$ voltage harmonic, $B_k$ indicates a sine amplitude of the $k^{th}$ voltage harmonic, $U_k\%$ indicates the $k^{th}$ voltage harmonic, $\Delta U_k\%$ indicates a change rate of the $k^{th}$ voltage harmonic, and $U_{k0}\%$ indicates an average value of the $k^{th}$ voltage harmonic.

Optionally, when determining the voltage total harmonic distortion based on the voltage harmonics and the change rates of the voltage harmonics, the determining unit 803 is further configured to compare a change rate of each voltage harmonic and a specified threshold of the change rate of the voltage harmonic to obtain a change factor of the voltage harmonic, and obtain the voltage total harmonic distortion based on the change factors of the voltage harmonics and the voltage harmonics.

Optionally, the voltage total harmonic distortion satisfies the following formulas:

$$U\% = \sum_{k=2}^{n} U_k\% \cdot S_k$$

$$S_k = \begin{cases} 1, & \Delta U_k\% \leq \Delta\varepsilon_k \\ -1, & \Delta U_k\% > \Delta\varepsilon_k \end{cases},$$

where U% indicates the voltage total harmonic distortion, $U_k\%$ indicates the $k^{th}$ voltage harmonic, $S_k$ indicates a change factor of the $k^{th}$ voltage harmonic, $\Delta U_k\%$ indicates the change rate of the $k^{th}$ voltage harmonic, and $\Delta\varepsilon_k$ indicates a specified threshold of the change rate of the $k^{th}$ voltage harmonic.

The foregoing apparatus 800 described in this embodiment of the present application may be a separate component, or may be integrated in another component. For example, the foregoing apparatus 800 provided in this embodiment of the present application may be an existing inverter, or may be a component that is integrated in the inverter.

It should be noted that, for a function implementation and an interaction mode of the units of the apparatus 800 in this embodiment of the present application, further refer to descriptions of the related method embodiments, and details are not described herein again.

In addition, the "units" may be implemented by an application-specific integrated circuit (ASIC), a processor that executes one or more software or firmware programs, a memory, an integrated logic circuit, and/or another component capable of providing the foregoing functions.

Figure 9:
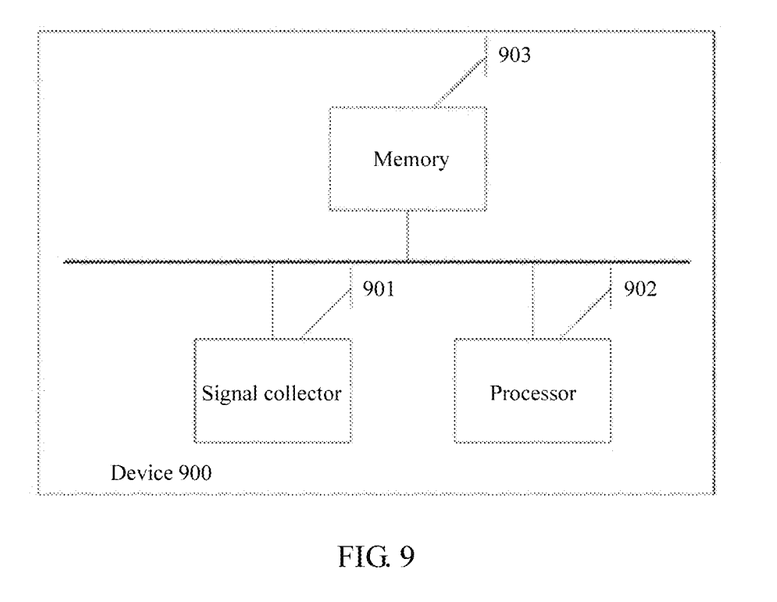
FIG. 9 is a schematic diagram of an islanding detection device for an inverter according to an embodiment of the present application.

Based on a same concept, as shown in FIG. 9, FIG. 9 is a schematic structural diagram of an islanding detection device 900 according to an embodiment of the present application. The device 900 includes a signal collector 901, a processor 902, and a memory 903, where the signal collector 901, the processor 902, and the memory 903 are connected to each other using a bus or connected in another connection manner.

The signal collector 901 is configured to sample an alternating voltage signal output from an alternating current port of an inverter.

The processor 902 is configured to call a program that is stored in the memory 903, to perform harmonic analysis on the alternating voltage signal output by the signal collector 901 to obtain various voltage harmonics and change rates of the voltage harmonics, determine a voltage total harmonic distortion based on the voltage harmonics and the change rates of the voltage harmonics, and if the voltage total harmonic distortion is greater than a specified threshold of the voltage total harmonic distortion, determine that an islanding effect of the inverter is detected.

The processor 902 may be a central processing unit (CPU), a general purpose processor, a digital signal processor (DSP), an ASIC, a field programmable gate array (FPGA) or another programmable logic device, a transistor logic device, a hardware component, or any combination thereof. The processor 902 may implement or execute various example logical blocks, modules, and circuits described with reference to disclosed content about a terminal in the present application. Alternatively, the processor 902 may be a combination of processors implementing a computing function, for example, a combination of one or more microprocessors or a combination of the DSP and a microprocessor.

The memory 903 may include a volatile memory, such as a random access memory (RAM). The memory 903 may also include a non-volatile memory, such as a read-only memory (ROM), a flash memory, a hard disk drive (HDD), or a solid state drive (SSD). The memory 903 may further include a combination of the foregoing types of memories.

Optionally, the signal collector 901 is further configured to, after sampling the alternating voltage signal output from the alternating current port of the inverter, perform filtering processing on the alternating voltage signal so as to perform harmonic analysis on the alternating voltage signal.

Optionally, the processor 902 is further configured to perform harmonic analysis on the alternating voltage signal using an FFT algorithm to obtain the voltage harmonics, calculate an average value of each voltage harmonic based on the voltage harmonic, and obtain the change rates of the voltage harmonics based on the voltage harmonics and the average values of the voltage harmonics.

Optionally, the voltage harmonics and the change rates of the voltage harmonics satisfy the following formulas:

$$A_k = \frac{\sum_{n=0}^{M-1} u[nT]\cos(2k\pi f)}{M/2}$$

$$B_k = \frac{\sum_{n=0}^{M-1} u[nT]\sin(2k\pi f)}{M/2}$$

$$U_k\% = \frac{\sqrt{A_k^2 + B_k^2}}{\sqrt{A_1^2 + B_1^2}} \times 100\%$$

$$\Delta U_k\% = |U_k\% - U_{k0}\%|,$$

where n indicates a quantity of sampling points and n=0, 1, 2, ..., M−1, T indicates a sampling period, f indicates a power frequency, k indicates a harmonic order and k=0, 1, 2, ..., M/2, u[nT] indicates a power grid voltage signal, $A_k$ indicates a cosine amplitude of a $k^{th}$ voltage harmonic, $B_k$ indicates a sine amplitude of the $k^{th}$ voltage harmonic, $U_k\%$ indicates the $k^{th}$ voltage harmonic, $\Delta U_k\%$ indicates a change rate of the $k^{th}$ voltage harmonic, and $U_{k0}\%$ indicates an average value of the $k^{th}$ voltage harmonic.

Optionally, the processor 902 is further configured to compare a change rate of each voltage harmonic and a specified threshold of the change rate of the voltage harmonic to obtain a change factor of the voltage harmonic, and obtain the voltage total harmonic distortion based on the change factors of the voltage harmonics and the voltage harmonics.

Optionally, the voltage total harmonic distortion satisfies the following formulas:

$$U\% = \sum_{k=2}^{n} U_k\% \cdot S_k$$

$$S_k = \begin{cases} 1, & \Delta U_k\% \leq \Delta \varepsilon_k \\ -1, & \Delta U_k\% > \Delta \varepsilon_k \end{cases},$$

where U% indicates the voltage total harmonic distortion, $U_k\%$ indicates the $k^{th}$ voltage harmonic, $\Delta U_k\%$ indicates the change rate of the $k^{th}$ voltage harmonic, and $\Delta \varepsilon_k$ indicates a specified threshold of the change rate of the $k^{th}$ voltage harmonic.

To sum up, according to the islanding detection method provided in the embodiments of the present application, the alternating voltage signal output from the alternating current port of the inverter is sampled, harmonic analysis is performed on the alternating voltage signal to obtain the voltage harmonics and the change rates of the voltage harmonics, the voltage total harmonic distortion is determined based on the voltage harmonics and the change rates of the voltage harmonics, and if the voltage total harmonic distortion is greater than the specified threshold of the voltage total harmonic distortion, it is determined that the islanding effect of the inverter is detected. According to this detection method, the voltage total harmonic distortion changes more significantly before and after the islanding effect of the inverter occurs in order to reduce an islanding detection dead zone and improve islanding detection reliability.

A person skilled in the art should understand that the embodiments of the present application may be provided as a method, a system, or a computer program product. Therefore, the present application may use a form of hardware only embodiments, software only embodiments, or embodiments with a combination of software and hardware. Moreover, the present application may use a form of a computer program product that is implemented on one or more computer-usable storage media (including but not limited to a disk memory, a compact disc ROM (CD-ROM), an optical memory, and the like) that include computer-usable program code.

The present application is described with reference to the flowcharts and/or block diagrams of the method, the device (system), and the computer program product according to the embodiments of the present application. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of another programmable data processing device to generate a machine such that the instructions executed by a computer or a processor of another programmable data processing device generate an apparatus for implementing a specific function in one or more processes in the flowcharts and/or in one or more blocks in the block diagrams.

These computer program instructions may be stored in a computer readable memory that can instruct the computer or another programmable data processing device to work in a specific manner such that the instructions stored in the computer readable memory generate an artifact that includes an instruction apparatus. The instruction apparatus implements a specific function in one or more processes in the flowcharts and/or in one or more blocks in the block diagrams.

These computer program instructions may be loaded onto a computer or another programmable data processing device such that a series of operations and steps are performed on the computer or the other programmable device, thereby generating computer-implemented processing. Therefore, the instructions executed on the computer or the other programmable device provides steps for implementing a specific function in one or more processes in the flowcharts and/or in one or more blocks in the block diagrams.

Although some embodiments of the present application have been described, a person skilled in the art can make changes and modifications to these embodiments once they learn the basic inventive concept. Therefore, the following claims are intended to be construed as to cover some embodiments and all changes and modifications falling within the scope of the present application.

Obviously, a person skilled in the art can make various modifications and variations to the embodiments of the present application without departing from the spirit and scope of the embodiments of the present application. The present application is intended to cover these modifications and variations provided that they fall within the scope of protection defined by the following claims and their equivalent technologies.

What is claimed is:

1. An islanding detection method for an inverter, comprising:
    sampling an alternating voltage signal output from an alternating current port of the inverter;
    performing harmonic analysis on the alternating voltage signal to obtain various voltage harmonics and change rates of the voltage harmonics;
    determining a voltage total harmonic distortion based on the voltage harmonics and the change rates of the voltage harmonics;
    determining that an islanding effect of the inverter is detected when the voltage total harmonic distortion is greater than a specified threshold of the voltage total harmonic distortion; and
    outputting an anti-islanding protection signal to a control circuit to enable the control circuit to trigger protection for the inverter.

2. The islanding detection method of claim 1, wherein after sampling the alternating voltage signal and before performing the harmonic analysis on the alternating voltage signal, the islanding detection method further comprises performing filtering processing on the alternating voltage signal to perform the harmonic analysis on the alternating voltage signal.

3. The islanding detection method of claim 2, wherein after performing the filtering processing on the alternating voltage signal, the islanding detection method further comprises obtaining a steady-state alternating voltage signal.

4. The islanding detection method of claim 1, wherein performing the harmonic analysis on the alternating voltage signal comprises:
    performing harmonic analysis on the alternating voltage signal using a fast Fourier transformation (FFT) algorithm to obtain the voltage harmonics;
    calculating an average value of each voltage harmonic based on a corresponding voltage harmonic; and
    obtaining the change rates of the voltage harmonics based on the voltage harmonics and average values of the voltage harmonics.

5. The islanding detection method of claim 4, wherein the voltage harmonics and the change rates of the voltage harmonics satisfy the following formulas:

$$A_k = \frac{\sum_{n=0}^{M-1} u[nT]\cos(2k\pi f)}{M/2};$$

$$B_k = \frac{\sum_{n=0}^{M-1} u[nT]\sin(2k\pi f)}{M/2};$$

$$U_k\% = \frac{\sqrt{A_k^2 + B_k^2}}{\sqrt{A_1^2 + B_1^2}} \times 100\%; \text{ and}$$

$$A_k = \frac{\sum_{n=0}^{M-1} u[nT]\cos(2k\pi f)}{M/2}$$

$$U_k\% = \frac{\sqrt{A_k^2 + B_k^2}}{\sqrt{A_1^2 + B_1^2}} \times 100\%$$

$$\Delta U_k\% = |U_k\% - U_{k0}\%|,$$

wherein the n indicates a quantity of sampling points and n=0, 1, 2, ..., M-1, wherein the T indicates a sampling period, wherein the f indicates a power frequency, wherein the k indicates a harmonic order and k=0, 1, 2, ..., M/2, wherein the u[nT] indicates a power grid voltage signal, wherein the $A_k$ indicates a cosine amplitude of a $k^{th}$ voltage harmonic, wherein the $B_k$ indicates a sine amplitude of the $k^{th}$ voltage harmonic, wherein the $U_k\%$ indicates the $k^{th}$ voltage harmonic, wherein the $\Delta U_k\%$ indicates a change rate of the $k^{th}$ voltage harmonic, and wherein the $U_{k0}\%$ indicates an average value of the $k^{th}$ voltage harmonic.

6. The islanding detection method of claim 1, wherein determining the voltage total harmonic distortion comprises:
    comparing a change rate of each voltage harmonic and a specified threshold of a corresponding change rate of a corresponding voltage harmonic to obtain a change factor of the corresponding voltage harmonic; and
    obtaining the voltage total harmonic distortion based on change factors of the voltage harmonics and the voltage harmonics.

7. The islanding detection method of claim 6, wherein the voltage total harmonic distortion satisfies the following formulas:

$$U\% = \sum_{k=2}^{n} U_k\% \cdot S_k; \text{ and}$$

$$S_k = \begin{cases} 1, & \Delta U_k\% \leq \Delta \varepsilon_k \\ -1, & \Delta U_k\% > \Delta \varepsilon_k \end{cases},$$

wherein the U% indicates the voltage total harmonic distortion, wherein the $U_k\%$ indicates a $k^{th}$ voltage harmonic, wherein the $S_k$ indicates a change factor of the $k^{th}$ voltage harmonic, wherein the $\Delta U_k\%$ indicates a change rate of the $k^{th}$ voltage harmonic, and wherein the $\Delta \varepsilon_k$ indicates a specified threshold of the change rate of the $k^{th}$ voltage harmonic.

8. An islanding detection apparatus for an inverter, comprising:
a memory comprising instructions; and
a processor coupled to the memory, where the instructions cause the processor to be configured to:
  sample an alternating voltage signal output from the alternating current port of an inverter;
  perform harmonic analysis on the alternating voltage signal to obtain various voltage harmonics and change rates of the voltage harmonics;
  determine a voltage total harmonic distortion based on the voltage harmonics and the change rates of the voltage harmonics;
  determine that an islanding effect of the inverter is detected when the voltage total harmonic distortion is greater than a specified threshold of the voltage total harmonic distortion; and
  output an anti-islanding protection signal to a control circuit to enable the control circuit to trigger protection for the inverter.

9. The islanding detection apparatus of claim 8, wherein after sampling the alternating voltage signal output from the alternating current port of the inverter, the instructions further cause the processor to be configured to perform filtering processing on the alternating voltage signal to perform the harmonic analysis on the alternating voltage signal.

10. The islanding detection apparatus of claim 8, wherein in a manner of performing the harmonic analysis on the alternating voltage signal, the instructions further cause the processor to be configured to:
  perform the harmonic analysis on the alternating voltage signal using a fast Fourier transformation (FFT) algorithm to obtain the voltage harmonics;
  calculate an average value of each voltage harmonic based on a corresponding voltage harmonic; and
  obtain the change rates of the voltage harmonics based on the voltage harmonics and average values of the voltage harmonics.

11. The islanding detection apparatus of claim 10, wherein the voltage harmonics and the change rates of the voltage harmonics satisfy the following formulas:

$$A_k = \frac{\sum_{n=0}^{M-1} u[nT]\cos(2k\pi f)}{M/2};$$

$$B_k = \frac{\sum_{n=0}^{M-1} u[nT]\sin(2k\pi f)}{M/2};$$

$$U_k\% = \frac{\sqrt{A_k^2 + B_k^2}}{\sqrt{A_1^2 + B_1^2}} \times 100\%; \text{ and}$$

$$A_k = \frac{\sum_{n=0}^{M-1} u[nT]\cos(2k\pi f)}{M/2}$$

$$U_k\% = \frac{\sqrt{A_k^2 + B_k^2}}{\sqrt{A_1^2 + B_1^2}} \times 100\%$$

$$\Delta U_k\% = |U_k\% - U_{k0}\%|,$$

wherein the n indicates a quantity of sampling points and n=0, 1, 2, . . . , M−1, wherein the T indicates a sampling period, wherein the f indicates a power frequency, wherein the k indicates a harmonic order and k=0, 1, 2, . . . , M/2, wherein the u[nT] indicates a power grid voltage signal, wherein the $A_k$ indicates a cosine amplitude of a $k^{th}$ voltage harmonic, wherein the $B_k$ indicates a sine amplitude of the $k^{th}$ voltage harmonic, wherein the $U_k\%$ indicates the $k^{th}$ voltage harmonic, wherein the $\Delta U_k\%$ indicates a change rate of the $k^{th}$ voltage harmonic, and wherein the $U_{k0}\%$ indicates an average value of the $k^{th}$ voltage harmonic.

12. The islanding detection apparatus of claim 8, wherein in a manner of determining the voltage total harmonic distortion, the instructions further cause the processor to be configured to:
  compare a change rate of each voltage harmonic and a specified threshold of a corresponding change rate of a corresponding voltage harmonic to obtain a change factor of the corresponding voltage harmonic; and
  obtain the voltage total harmonic distortion based on change factors of the voltage harmonics and the voltage harmonics.

13. The islanding detection apparatus of claim 12, wherein the voltage total harmonic distortion satisfies the following formulas:

$$U\% = \sum_{k=2}^{n} U_k\% \cdot S_k; \text{ and}$$

$$S_k = \begin{cases} 1, & \Delta U_k\% \leq \Delta \varepsilon_k \\ -1, & \Delta U_k\% > \Delta \varepsilon_k \end{cases},$$

wherein the U% indicates the voltage total harmonic distortion, wherein the $U_k\%$ indicates a $k^{th}$ voltage harmonic, wherein the $S_k$ indicates a change factor of the $k^{th}$ voltage harmonic, wherein the $\Delta U_k\%$ indicates a change rate of the $k^{th}$ voltage harmonic, and wherein the $\Delta \varepsilon_k$ indicates a specified threshold of the change rate of the $k^{th}$ voltage harmonic.

14. A power supply system, comprising:
a control circuit;
an islanding detection apparatus coupled to the control circuit; and
an inverter, wherein a main circuit of the inverter is coupled to the islanding detection apparatus and the control circuit, and wherein the inverter is configured to convert direct current power to alternating current power, wherein the islanding detection apparatus is configured to:
sample an alternating voltage signal output from an alternating current port of the inverter;
perform harmonic analysis on the alternating voltage signal to obtain various voltage harmonics and change rates of the voltage harmonics;
determine a voltage total harmonic distortion based on the voltage harmonics and the change rates of the voltage harmonics;
determine that an islanding effect of the inverter is detected when the voltage total harmonic distortion is greater than a specified threshold of the voltage total harmonic distortion; and
output an anti-islanding protection signal to the control circuit, and wherein the control circuit is configured to:
detect the anti-islanding protection signal; and
trigger protection for the inverter after detecting the anti-islanding protection signal.

15. The power supply system of claim 14, wherein the islanding detection apparatus comprises:
a memory comprising instructions; and
a processor coupled to the memory, where the instructions cause the processor to be configured to:
sample the alternating voltage signal output from the alternating current port of the inverter;
perform the harmonic analysis on the alternating voltage signal to obtain the voltage harmonics and the change rates of the voltage harmonics;
determine the voltage total harmonic distortion based on the voltage harmonics and the change rates of the voltage harmonics; and
determine that the islanding effect of the inverter is detected when the voltage total harmonic distortion is greater than the specified threshold of the voltage total harmonic distortion.

16. The power supply system of claim 15, wherein after sampling the alternating voltage signal output from the alternating current port of the inverter, the instructions further cause the processor to be configured to perform filtering processing on the alternating voltage signal to perform the harmonic analysis on the alternating voltage signal.

17. The power supply system of claim 15, wherein in a manner of performing the harmonic analysis on the alternating voltage signal, the instructions further cause the processor to be configured to:
perform the harmonic analysis on the alternating voltage signal using a fast Fourier transformation (FFT) algorithm to obtain the voltage harmonics;
calculate an average value of each voltage harmonic based on a corresponding voltage harmonic; and
obtain the change rates of the voltage harmonics based on the voltage harmonics and average values of the voltage harmonics.

18. The power supply system of claim 17, wherein the voltage harmonics and the change rates of the voltage harmonics satisfy the following formulas:

$$A_k = \frac{\sum_{n=0}^{M-1} u[nT]\cos(2k\pi f)}{M/2};$$

$$B_k = \frac{\sum_{n=0}^{M-1} u[nT]\sin(2k\pi f)}{M/2};$$

$$U_k\% = \frac{\sqrt{A_k^2 + B_k^2}}{\sqrt{A_1^2 + B_1^2}} \times 100\%; \text{ and}$$

$$\Delta U_k\% = |U_k\% - U_{k0}\%|,$$

wherein the n indicates a quantity of sampling points and n=0, 1, 2, . . . , M−1, wherein the T indicates a sampling period, wherein the f indicates a power frequency, wherein the k indicates a harmonic order and k=0, 1, 2, . . . , M/2, wherein the u[nT] indicates a power grid voltage signal, wherein the $A_k$ indicates a cosine amplitude of a $k^{th}$ voltage harmonic, wherein the $B_k$ indicates a sine amplitude of the $k^{th}$ voltage harmonic, wherein the $U_k\%$ indicates the $k^{th}$ voltage harmonic, wherein the $\Delta U_k\%$ indicates a change rate of the $k^{th}$ voltage harmonic, and wherein the $U_{k0}\%$ indicates an average value of the $k^{th}$ voltage harmonic.

19. The power supply system of claim 15, wherein in a manner of determining the voltage total harmonic distortion, the instructions further cause the processor to be configured to:
compare a change rate of each voltage harmonic and a specified threshold of a corresponding change rate of a corresponding voltage harmonic to obtain a change factor of the corresponding voltage harmonic; and
obtain the voltage total harmonic distortion based on change factors of the voltage harmonics and the voltage harmonics.

20. The power supply system of claim 19, wherein the voltage total harmonic distortion satisfies the following formulas:

$$U\% = \sum_{k=2}^{n} U_k\% \cdot S_k; \text{ and}$$

$$S_k = \begin{cases} 1, & \Delta U_k\% \leq \Delta\varepsilon_k \\ -1, & \Delta U_k\% > \Delta\varepsilon_k \end{cases},$$

wherein the U% indicates the voltage total harmonic distortion, wherein the $U_k\%$ indicates a $k^{th}$ voltage harmonic, wherein the $S_k$ indicates a change factor of the $k^{th}$ voltage harmonic, wherein the $\Delta U_k\%$ indicates a change rate of the $k^{th}$ voltage harmonic, and wherein the $\Delta\varepsilon_k$ indicates a specified threshold of the change rate of the $k^{th}$ voltage harmonic.

* * * * *